(12) United States Patent
Dugal

(10) Patent No.: US 10,573,620 B2
(45) Date of Patent: Feb. 25, 2020

(54) SPRING ELEMENT FOR A POWER SEMICONDUCTOR MODULE

(71) Applicant: ABB Schweiz AG, Baden (CH)

(72) Inventor: Franc Dugal, Benglen (CH)

(73) Assignee: ABB Schweiz AG, Baden (CH)

( * ) Notice: Subject to any disclaimer, the term of this patent is extended or adjusted under 35 U.S.C. 154(b) by 23 days.

(21) Appl. No.: 15/852,325

(22) Filed: Dec. 22, 2017

(65) Prior Publication Data
US 2018/0122768 A1 May 3, 2018

Related U.S. Application Data

(63) Continuation of application No. PCT/EP2016/064223, filed on Jun. 20, 2016.

(30) Foreign Application Priority Data

Jun. 22, 2015 (EP) .................................. 15173145

(51) Int. Cl.
*H01L 23/00* (2006.01)
*H01L 25/07* (2006.01)
(Continued)

(52) U.S. Cl.
CPC ............ *H01L 24/72* (2013.01); *H01L 23/492* (2013.01); *H01L 25/072* (2013.01); *H01L 25/11* (2013.01);
(Continued)

(58) Field of Classification Search
CPC ..... H01L 23/492; H01L 24/72; H01L 25/072; H01L 25/11; H01L 25/18; H01R 12/714; H01R 12/73
See application file for complete search history.

(56) References Cited

U.S. PATENT DOCUMENTS 6,561,817 B1 * 5/2003 Ma ...................... H05K 7/1069
439/66
2006/0240685 A1 * 10/2006 Herr ...................... H01L 24/72
439/66
(Continued)

FOREIGN PATENT DOCUMENTS

DE 2725847 A1 12/1978
EP 0989611 A2 3/2000
(Continued)

OTHER PUBLICATIONS

Eddy Current Technology, Eddy Current Technology Incorporated, Nov. 14, 2013, pp. 1 (Year: 2013).*
(Continued)

*Primary Examiner* — Michelle Mandala
(74) *Attorney, Agent, or Firm* — Taft Stettinius & Hollister LLP; J. Bruce Schelkopf

(57) ABSTRACT

The present invention relates to a spring element for a power semiconductor module, wherein the spring element includes a first part made from a first material and a second part made from a second material, the first material being different from the second material, wherein the first part comprises both a first contact portion having a first contact and a second contact portion having a second contact, wherein the first part comprises an electrically conductive path formed from the first contact portion to the second contact portion, and wherein the second part is adapted for exerting a spring force (FS) onto the first contact portion and the second contact portion for pressing the first contact to a first contact area of a power semiconductor module and the second contact to a second contact area of a power semiconductor module. Such a spring element may form a press contact in a power semiconductor module and may be less bulky (Continued)

compared to solutions in the prior art and may be formed cost-sparingly.

18 Claims, 1 Drawing Sheet

(51) Int. Cl.
| | |
|---|---|
| H01L 25/11 | (2006.01) |
| H01L 25/18 | (2006.01) |
| H01R 12/73 | (2011.01) |
| H01R 12/71 | (2011.01) |
| H01L 23/492 | (2006.01) |

(52) U.S. Cl.
CPC ........... *H01L 25/18* (2013.01); *H01R 12/714* (2013.01); *H01R 12/73* (2013.01); *H01L 25/071* (2013.01); *H01L 25/074* (2013.01); *H01L 25/112* (2013.01); *H01L 25/115* (2013.01); *H01L 25/117* (2013.01)

(56) References Cited

U.S. PATENT DOCUMENTS

| | | | | |
|---|---|---|---|---|
| 2007/0123084 A1* | 5/2007 | Takehara | ............. | H01R 13/187 439/268 |
| 2009/0179315 A1* | 7/2009 | Jereza | .................. | H01L 21/565 257/676 |
| 2012/0211799 A1 | 8/2012 | Liu et al. | | |

FOREIGN PATENT DOCUMENTS

| | | |
|---|---|---|
| EP | 1024530 A1 | 8/2000 |
| EP | 2827366 A1 | 1/2015 |

OTHER PUBLICATIONS

European Patent Office, International Search Report & Written Opinion issued in corresponding Application No. PCT/EP2016/064223, dated Sep. 28, 2016, 8 pp.

European Patent Office, Search Report issued in corresponding Application No. 15173145.2, dated Oct. 29, 2015, 4 pp.

* cited by examiner

SPRING ELEMENT FOR A POWER SEMICONDUCTOR MODULE

TECHNICAL FIELD

The present invention relates to a spring element for a power semiconductor module. The present invention further relates to a power semiconductor module comprising such a spring element.

BACKGROUND ART

In high power semiconductor modules, an electrical control path often is required to let the module control when to turn on and when to turn off. As the electrical resistivity and inductivity of this path typically has a strong influence on the switching behaviour of the module, it is recommended that this path shows very good electrical conduction.

For some type of high power modules the control path can be simply realised with the help of an aluminium or copper wire bond. But especially for press pack type modules, this control path is realised with the help of a press contact. Presently those press contacts are mostly made from copper spring like parts. However, copper has no spring capability, therefore the parts need to be relatively small to allow them to deform when they are pressed and thus in case they form the press contact. The absence of spring capability as described above also prevents those parts to exert high force on the contact area. Therefore, since the contact resistance is inversely proportional to the applied force to the press contact, those contacts do not show very low contact resistivity but in contrast thereto, the electrical conductivity may be decreased.

The spring capability can be greatly improved by using an alloy instead of pure copper. However, the addition of some alloying element like beryllium may reduce the electrical conductivity of the material and may further considerably increase the cost of the material.

Standard spring steel will provide good mechanical properties, but those steel as well shows comparably high electrical resistivity.

Known from EP 0 989 611 B1 is a power semiconductor module which is formed from small-area individual chips and in which a short circuit of an individual chip does not lead to total failure of the module. According to this prior art, a layer composed of a suitable material, for example, silver or aluminium, is brought into direct contact with one or both of the main electrodes of the silicon semiconductor. The material of this layer may form an eutectic alloy with silicon. It is further provided that a contact stamp electrically connects the chips.

Document EP 2 827 366 A1 describes a power semiconductor module. Such a power semiconductor module comprises a spring element which has an upper contact area for directly or indirectly connecting the spring element to a load plate and which has a lower contact area for directly or indirectly connecting the spring element to a power semiconductor device, wherein the spring element has a plurality of grooves located along the circumference and restricted with respect to the circumference, wherein the grooves provide a spring deflection of the spring element. Such a spring element may be formed as a one-piece unit and may further be formed of copper or based on copper.

Document US 2012/0211799 A1 describes a power semiconductor module. Such a power semiconductor module comprises an electrically conductive area on the baseplate, which is electrically isolated from the base plate. It is further described that the electrically conductive area may be connected by a contact piston.

The publication "The spring for the $21^{st}$ century" from Helical Products Company further shows spring elements, which are formed as a flexible helix. Such springs are formed from materials such as stainless steel, aluminum, titanium, alloys or plastics.

Known from EP 1 024 530 A1 is further a power semiconductor module, at which a semiconductor chip is contacted via a contact element with a main contact. The contact element comprises two contact areas between which a bulky spiral spring is provided.

However, the solutions according to the prior art still have potential for improvements.

EP 1 024 530 A1 discloses a spring element for a power semiconductor module, whereby the spring element comprises a first part made from a first material and a second part made from a second material. The first part comprises both a first contact portion having a first contact and a second contact portion having a second contact and the first part comprises an electrically conductive path formed from the first contact portion to the second contact portion. The second part is adapted for exerting a spring force onto the first contact portion and the second contact portion for pressing the first contact to a first contact area of a power semiconductor module and the second contact to a second contact area of a power semiconductor module.

DE 27 25 847 A1 also a spring element for a power semiconductor is disclosed

DISCLOSURE OF INVENTION

It is an object of the present invention to provide a measure for at least partly preventing at least one disadvantage known from the prior art. It is particularly an object of the present invention to provide a power semiconductor module having a press contact which both shows a good spring force and a good electrical conductivity.

This object is achieved by a spring element according to independent claim 1. This object is further solved by a power semiconductor module according to independent claim 13. Advantageous embodiments are given in the dependent claims.

In particular, the present invention provides a spring element for a power semiconductor module, wherein the spring element comprises a first part made from a first material and a second part made from a second material, the first material being different from the second material, wherein the first part comprises both a first contact portion having a first contact and a second contact portion having a second contact, wherein the first part comprises an electrically conductive path formed from the first contact portion to the second contact portion, and wherein the second part is adapted for exerting a spring force onto the first contact portion and the second contact portion for pressing the first contact to a first contact area of a power semiconductor module and the second contact to a second contact area of a power semiconductor module.

Such a spring element for a power semiconductor module may especially form a press contact between two contact areas of the power semiconductor module and may thus form, or close, respectively, an electric connection in a press pack type power semiconductor module, for example. The spring element may as such be formed for closing or being part of, respectively, a control path of the power semiconductor module. The control path may serve for controlling a switching process of a power semiconductor device, for example.

The spring element as described is not formed in one piece, but it comprises at least two different parts and further two different materials. In detail, the spring element comprises a first part and a second part. The first part is formed of a first material, whereas the second part is formed of a second material. The first material is different from the second material.

The first part comprises both a first contact portion having a first contact and a second contact portion having a second contact, wherein the first part comprises an electrically conductive path formed from the first contact portion to the second contact portion and thus from the first contact to the second contact of the first part.

Preferably, the first contact portion is located opposite to the second portion such, that the first part is provided for electrically connecting a first contact area and a second contact area of respective contacts in the power semiconductor module which have to be connected by the spring element. This is especially possible as the first part comprises an electrically conductive path between the first contact portion and the second contact portion and thus, in a working mode of the spring element, between the first contact area and the second contact area.

In other words, the spring element comprises two contacts, which contacts are designed for coming in contact with contact areas, or contacting points, respectively. Therefore, the contacts and the contact portions of the first part may be adapted especially with regard to geometry and surface characteristics to the respective contact areas they come in contact with. Further, the size of the respective contact portions of the spring element as well as the contact areas of the power semiconductor module may be adapted to the desired current carrying capability. In other words, the areas at which the contacts come into contact with the contact area may be adapted to the resistivity of said contacts which is allowed to provide the respective current carrying capability.

The second part is provided for exerting a spring force onto the first contact portion and the second contact portion particularly for pressing the first contact to the first contact area and the second contact to the second contact area of the power semiconductor module. This may be realized especially advantageously in that the first contact portion and the second contact portion are provided at different ends of the first part. Therefore, the spring element serves for forming a press contact.

The respective materials of the first part and the second part, respectively, are chosen in order to fulfil the above-named requirements. In detail, it is especially provided that the first material has a higher electrical conductivity compared to the second material and that the second material has a higher spring force, or spring restoring force, respectively, compared to the first material.

Such a spring element for a power semiconductor module especially for forming a press contact for example in a control path of a power semiconductor module may provide significant advantages over the solutions of the prior art.

In detail, the present solution of a spring element achieves combining two generally different requirements of spring contacts, i.e. good conductivity and good spring force, thereby allowing to essentially prevent the respective disadvantages of the prior art and to maintain the advantages thereof. In other words, the present invention serves to achieve both requirements which are required for an effective spring contact and which are hard to combine according to the prior art.

Due to the fact that the first part and the second part are provided for fulfilling different requirements and are formed from different materials, the respective material may be adapted to the respective objective.

It is not necessary like known from the prior art to have a single material which combines both, acceptable electrical conductivity as well as acceptable spring forces. In contrast thereto, both good spring force and both good electrical conductivity may be achieved.

This may under circumstances significantly improve the working behaviour of the spring element.

According to the prior art, a compromise between good electrical conductivity and good spring force often had to be chosen, which, however not for all applications resulted in acceptable results.

According to the present invention, however, it may be prevented that a good electric conductivity inside the spring element is focussed on, whereas spring force may be reduced, or vice versa. Such a solution according to the prior art may under circumstances lead to reduced lifetimes and reduced reliability.

In contrast thereto, the separation of the current path and the spring capability has according to the present invention been achieved by using two different parts. Therefore, each of the parts and the materials used are adapted to the respective requirements. In fact, both good spring forces and good electric conductivity may be achieved. Therefore, a good electrical conductivity inside the spring element, or through the first part, may be achieved which however may be combined with a high force press contact by respectively adapting the first and the second material. As a result, the contact resistivity between the spring element and the corresponding contact areas of the power semiconductor module may as well be kept low, which in turn allows a high conductive current path as well at the contact regions between the spring element and the contact areas due to low contact resistance.

Both parts are joined into one spring element which accomplishes two different and competing tasks in a very convenient and promising manner. The two parts may thereby be fixated one to the other, such as by form closure or by traction or by adhesive bond or further fixation processes such as welding or soldering and further. This allows an especially easy assembly of the power semiconductor module.

Lifetime as well as reliability of the conductive path may be improved which in turn improves the lifetime as well as reliability and thus the security of the whole power semiconductor module.

Apart from the above, such a spring element may have the further advantage according to which it may be less bulky compared to spring elements of the prior art and may therefore be usable as well in applications showing only few free volume. Due to the arrangement as described before, the spring element can still provide good force and spring capability even at low spatial requirements.

Additionally, a spring element as described is producible very cost-saving and it is further very easy to assemble as it may mainly comprise two parts. Therefore, production methods as well as costs of such a spring elements may show significant advantages.

Especially in case the spring element is adapted for being part of a control path, the spring element needs to carry low current, only, such as below 10 A, and need to support relatively low voltage, such as below 25V. Therefore, this control path and accordingly the spring element does not need to be a robust electrical construction. Therefore, the spring element may be formed having small dimensions and further being cost-saving.

Furthermore, due to the fact that the the second part is provided for exerting a spring force to the first contact and the second contact for pressing the first contact to the first contact area and the second contact to the second contact area, such a spring element is producible very easily. In fact, the first part may be fixated to the second part in a non-working mode, i.e. in case the second part does not exert a spring force or only few spring force. However, in case the second part of the spring element exerts a spring force, it presses against the first part and thus fixates the two parts to one another. Therefore, the spring force may as well be used for fixating the first and the second part, respectively, in a non-working mode, i.e. in case the spring element is a stand-alone part and not assembled in a power semiconductor module. As a result, a self-assembly may be realized by simply arranging the first part and the second part respectively in the power semiconductor module.

It becomes clear that the first part, or the first material, respectively advantageously is flexible and not rigid so that the spring element may easily be assembled in a power module.

It may further be provided that the first part embraces, or encompasses, respectively, the at least a portion of second part such, that the first part, or its contacts, are outside the second part in the direction of the spring force acting to the contact portions of the first part. Further, this may be realized in that the first part embraces, or encompasses, respectively, the second part, or one or more portions of the latter, respectively, in order to get a secure fixation. This may allow forming a self-assembly especially easily even in a state at which the spring element is not located in a power semiconductor device.

It is further advantageous, that the first part comprises both the first contact and the second contact. Especially according to this, the spring element may be formed with a limited number of parts, allowing an easy and cost-saving production process. Apart from that, the conductivity may be especially high due to the fact that no connections of different parts have to be present in the first part. In contrast thereto, the current may flow completely through one part and one material, allowing forming an especially low resistive current path.

It is, however, possible to locate electrical conductors between the contacts of the spring element and the respective contact areas for whatever reason.

To summarize, a spring element as described above is producible easily and cost saving and it is further possible to combine a low resistive current path with good spring properties which can apply high forces to the respective contacts, allowing low resistive pressure contacts for power semiconductor modules.

According to an embodiment, the second part comprises a first press portion, a second press portion, and a deformation portion for providing a spring force to the first press portion and the second press portion, wherein the first press portion is located opposite to the second press portion with regard to the deformation portion, wherein the first contact portion is located in vicinity to the first press portion and the second contact portion is located in vicinity to the second press portion such, that the spring force exerted by the deformation portion presses the first press portion against the first contact portion and the second press portion against the second contact portion, particularly in opposite directions.

According to this embodiment it is provided that at opposite ends of the second part, in each case a press portion is provided. The press portions each serve for exerting a spring force to the contact portions of the first part which in turn allows pressing the contact portions of the first part against respective contact areas of the power semiconductor module.

The spring force may be formed by the deformation portion which is provided between the press portions with regard to the exerted spring force. In fact, the deformation portion may be pressed together and may thus be deformed, or compressed, respectively, in particular in a direction from the first pressing portion to the second pressing portion, and/or vice versa. Such a deformation may, due to the properties of the second material having a high spring force, exert a spring force, or restoring force, respectively onto the pressing portions and thus the contact portions. This allows the effect of forming a press contact as described above.

Especially such an embodiment may allow an easy and cost-saving producability and further an effective combination of high spring forces together with a low resistive conductive path.

Further, the deformation portion may be formed and adapted to exerting a high spring force and the press portions may be designed for having an effective contact to the contact portions of the first part, wherein it is not strictly required that the press portions exert a spring force. Therefore, especially according to this embodiment due to an effective adaptability of the single portions and their geometry, an especially defined and well predictable press contact may be achieved. It thus becomes clear that the press portions and the deformation portions are not parts of a homogeneously formed part, bit that the press portions and the deformation portions advantageously have different shapes and forms in order to achieve the desired properties.

According to a further embodiment, at least one of the first press portion, the second press portion, the first contact portion and the second contact portion at least partly proceed essentially perpendicular to the direction at which the spring force acts on the contact portion. Essentially perpendicular according to the present invention shall particularly mean an angle of ≥45° to ≤135°, particularly of ≥70° to ≤110°, such as of 80° to ≤100°. This embodiment allows providing a conductive path having an especially low resistivity. This may be mainly due to the fact that a contact between the spring element and the respective contact areas may have a comparably large expansion and further a high pressing force leading to a low resistive contact. This however, may still be combined with an easy and cost-saving production method and with the compact and space-saving arrangement of the spring element.

It may thus preferably provided that the first press portion, the second press portion, the first contact portion and the second contact portion at least partly proceed parallel to each other and further in a state assembled in a module parallel to the contact areas of the power semiconductor device with which the contact portions may come in contact to.

According to a further embodiment, the first part forms a first bracket and the second part forms a second bracket. It may be provided in an especially advantageous manner that the first bracket and the second bracket are fixated to one another like it is described in detail in a general manner down below.

According to this embodiment, a first bracket may be provided for forming a low resistive current path and a second bracket may be provided for generating the spring force. The first bracket advantageously has an arrangement which allows a great flexibility and one contact portion at each end region of the bracket. In order that such a low resistive bracket does not have to have good spring force properties and thus under circumstances cannot provide high spring forces, the second bracket, which may be formed from a material having a high spring force, may be provided as a second corresponding part for exerting a spring force.

Especially by using brackets as the first and the second parts, it may be provided that the spring element is formed less bulky compared to solutions of the prior art.

A bracket in the sense of the present invention shall particularly mean a belt-like part, or band like part, respectively which may have in general any cross-section, such as in a non-limiting manner a circular or oval or rectangular cross-section. The extension of the bracket may be as follows: The belt-like structure which forms the bracket, may have a thickness in the range of ≥0.1 mm to ≤1.5 mm, such as ≥0.2 mm to ≤1 mm, for example 0.5 mm, may have a width in the range of ≥0.5 mm to ≤30 mm, such as ≥2 mm to ≤20 mm, and may have a length in the range of ≥5 mm to ≤25 mm, such as ≥10 mm to ≤20 mm, for example 15 mm, wherein the above-named values are in no way restricting the present invention.

The first part, or first bracket, is particularly formed such, that it may form a contact at both opposite end regions of the longitudinal extension of the bracket for contacting both a first contact area and a second contact area. The second part or the second bracket may be formed such, that it exerts a spring force such, that the first contact and the second contact each are pressed against the respective contact areas of a power semiconductor module in order to close a conductive path by forming a press contact.

Each of the brackets and especially the second bracket may essentially form a semicircle arrangement, s-form arrangement or further, wherein such a semicircle or s-form arrangement, for example, may serve especially for the second part as resulting in an appropriate restoring force, or spring force, respectively in opposite direction. Therefore, such an arrangement may form or be part of a deformation portion like described above.

The form of each bracket may allow them to be attached one to another and to work together as one part providing the good electrical path as well as a good spring capability. The joining of those two brackets may thus be a result of a careful form adaption enabling an outside first bracket to squeeze the second bracket at both contacts. Once pressed together, the steel bracket presses on the exceeding parts of the first bracket and strengthened the attachment like it is in detail described down above. It may preferably be provided that the end portions of the contact portions of the first bracket protrude the end portions of the press portions of the second bracket with regard to the longitudinal extension of the belt like material forming the bracket. This may allow an especially secure fixation.

Further, a spring element which is formed of two brackets may be formed especially cost-saving due to its easy assembly and limited amount of material required for forming such a spring element.

According to a further embodiment, the first part is fixated to the second part by at least one of a friction connection and a form-locked connection.

According to this embodiment, it may be provided that the first part and the second part are fixated to one another even in a state in which the spring element is not located in a power semiconductor module in contact to contact areas and is thus a stand-alone part. This allows an especially easy processing of the spring element as the two parts act together as one part and may be assembled into the power semiconductor module especially easily. Therefore, the production process of the power semiconductor device may be improved.

This embodiment may be especially advantageous in case the first part is fixated to the second part by at least one of a friction connection and a form-locked connection. This allows fixating the two parts simply by bringing these in contact to each other in the respective configuration, thereby allowing the respective fixation. For example, one part may be pressed or clamped into the other. This as well allows an especially easy assembly of the spring element and thus of the power semiconductor module as no further fixation methods have to be performed but the fixation will be formed automatically when positioning the respective elements. The fixation force may thereby be provided by means of the spring force which acts on the contact portions even in a state at which the spring element is not in contact to the contact areas.

For example in case the contact portions or a part of the latter at least partly embrace, or enframes, respectively, the press portions or a part of the latter like described above, a form-locked connection may be provided.

However, it may additionally be advantageous if, alternatively or additionally, a friction connection of the first part and the second part may be realized. With this regard, already a small spring force which may be exerted from the second part to the first part in a stand-alone part may be sufficient in order to achieve such a fixation.

It may be especially advantageous in case an enframing of the second part with the first part may be realized in the direction of the spring force at the respective contact portion as well as in the opposite direction and additionally in at least two opposite directions being essentially perpendicular to the spring force. This may be realized, for example, in that both the contact portion and the press portion have an essentially oval form and preferably touching each other, wherein the oval form comprises the contact at a straight portion of the oval form essentially perpendicular to the spring force and two semi-circular sections provided subsequent and thus adjacent to the straight portion, wherein the oval form is opened in order to let the second part proceed through that opening.

According to a further embodiment, the spring element consists of the first part and the second part. This embodiment allows an especially easy and cost-saving production of the spring element. In fact, the parts of the spring element may be reduced to only two. Therefore, in case the two elements are brought into the desired configuration with regard to each other, the spring element is ready to be assembled into a power semiconductor module. Apart from that, such a spring element may be formed significantly less bulky, with less material and thus with less weight compared to prior art solutions and thus having especially low spatial requirements.

According to a further embodiment, the first part and the second part each are formed as one-piece parts. This embodiment, again, may provide an especially cost-saving production process. This may be mainly due to the fact that the first and the second parts as such may be formed easily and cost-saving as no plurality of parts have to be assembled for forming each of the first and the second part.

According to a further embodiment, it may be provided that the first material and thus the first part has an electric conductivity of equal or more than $2.0 \times 10^7$ S/m which may be determined according to ASTM B193-02 (2014) or ASTM E10047-09. Alternatively or additionally it may be provided that the second material and thus the second part has a spring force being determined by the young modulus of equal or more than 100 GPa, which may be determined according to ASTM E111-04(2010). Especially according to this embodiment, a low resistive current path may be provided due to the fact that the press contact may be formed especially effectively and with low resistance. Further, the conductive path inside the material may have a high conductivity. Therefore, the current carrying capability may be especially high allowing both low current applications regarding the formed path as well as high current applications.

It may further be provided that the first material is selected from the group consisting of copper, silver and aluminum. Alternatively or additionally it may be provided that the second material is selected from the group consisting of steel, steel alloys, copper alloys, such as copper-beryllium alloys, bronze alloys, such as bronze-phosphor alloys, or nickel alloys such as the ones being known under their name Hastelloy from the firm Haynes International, Inc. Especially the above materials, or material combinations, respectively, may show a low resistive path as copper shows a good electrical conductivity whereas steel shows a high spring force.

Regarding further technical features and advantages of the spring element as described, it is referred to the description of the power semiconductor module, the figures and the description of the figures, and vice versa.

The present invention further relates to a power semiconductor module, wherein the power semiconductor module comprises at least one spring element like it is described in detail above. It may be especially advantageous that the spring element forms part of a control path for controlling the power semiconductor module such as a working mode, for example the switching behavior of a power semiconductor device, of the power semiconductor module. According to this, the spring element may be located between an electrically conductive bottom plate, or ground plate, respectively, and an electrically conductive top plate. Further, the spring element may be located at least on one side in contact with a gate contact of a power semiconductor device and may thus form a gate contact pin, wherein the opposite side of the spring element may be in contact with an electrically conductive top plate. The afore-named ground plate and top plate or gate contact may comprise respective contact areas which are in contact with the respective contacts of the spring element.

Next to providing a pure electrical connection, a press contact like described above may serve to compensate any misalignments, non-planarities and height differences of different parts of the module.

To summarize, such a power semiconductor module may provide a press contact being producible cost-saving and less bulky compared to solutions of the prior art.

Regarding further technical features and advantages of the power semiconductor module as described, it is referred to the description of the spring element, the figures and the description of the figures, and vice versa.

BRIEF DESCRIPTION OF DRAWINGS

Additional features, characteristics and advantages of the subject-matter of the invention are disclosed in the subclaims, the figures and the following description of the respective figures and example, which—in an exemplary fashion—show an embodiment and example of a spring element according to the invention.

In the figures.

DETAILED DESCRIPTION OF THE INVENTION

Figure 1:
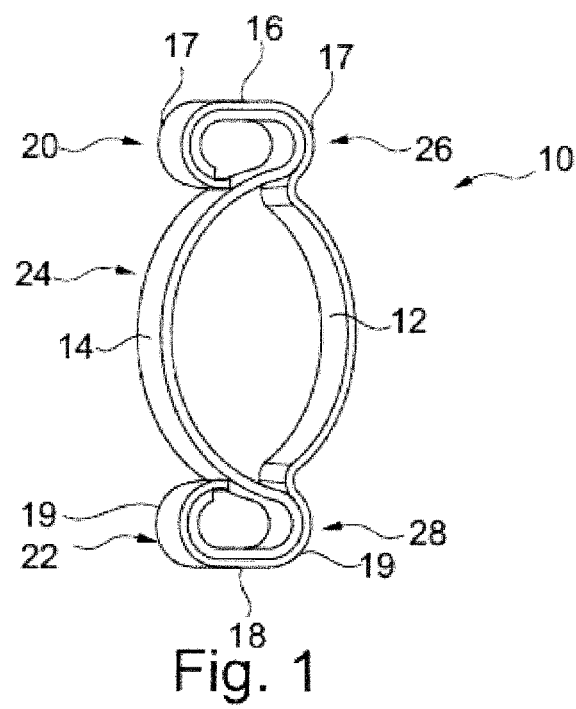
FIG. 1 shows an embodiment of a spring element according to the invention.
Figure 2:
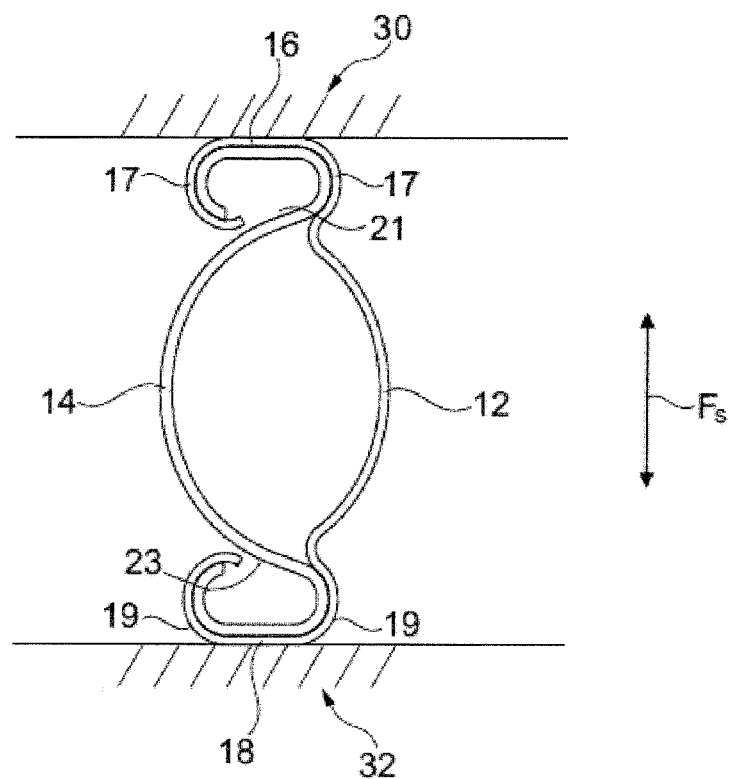
FIG. 2 shows the spring element according to FIG. 1 in a power semiconductor module.

FIG. 1 shows an embodiment of a spring element 10 according to the invention and FIG. 2 shows the respective spring element 10 in a power semiconductor module. The spring element 10 is particularly suitable for mounting it into a power semiconductor module and especially for forming a press contact in a control path of the power semiconductor module.

The spring element 10 comprises a first part 12 made from a first material and a second part 14 made from a second material, the first material being different from the second material. In detail the first material may be selected from the group consisting of copper, silver and aluminum, and/or the second material may be selected from the group consisting of steel, steel alloys, copper alloys, bronze alloys, or nickel-alloys. For example, the first part 12 may be formed from copper and the second part 14 may be formed from steel.

It can further be seen that the spring element 10 consists of the first part 12 and the second part 14, wherein both the first part 12 and the second part 14 are formed as one-piece parts and are further formed as brackets. Therefore, no further parts are required.

The first part 12 comprises both a first contact portion 26 having a first contact 16 and a second contact portion 28 having a second contact 18, wherein the first part 12 comprises an electrically conductive path formed from the first contact portion 26 to the second contact portion 28.

The second part 14 is adapted for exerting a spring force $F_S$ onto the first contact portion 26 and the second contact portion 28 for pressing the first contact 16 to a first contact area 30 and the second contact 18 to a second contact area 32. The first contact area 30 may be part of a top plate and the second contact area 32 may be part of a gate contact, or ground plate, for example.

In detail it is provided that the second part 14 comprises a first press portion 20, a second press portion 22, and a deformation portion 24 for providing a spring force $F_S$ to the first press portion 20 and the second press portion 22, wherein the first press portion 20 is located opposite to the second press portion 22 with regard to the deformation portion 24. The first contact portion 26 is further located in vicinity to the first press portion 20 and the second contact portion 28 is located in vicinity to the second press portion 22 such, that the spring force $F_S$ exerted by the deformation portion 24 presses the first press portion 20 against the first contact portion 26 and the second press portion 22 against the second contact portion 28 and thus the latter to the contact areas 30, 32, respectively.

It may further be seen that the first press portion 20, the second press portion 22, the first contact portion 26 and the second contact portion 28 at least partly proceed essentially perpendicular to the direction at which the spring force $F_S$ acts on the first contact portion 26 and the second contact portion 28.

It can further be seen that both the contact portions 26, 28 and the press portions 20, 22 have an essentially oval form and preferably touching each other proceeding that oval form. The oval form comprises the contacts 16, 18 forming a straight portion of the oval form essentially perpendicular to the spring force $F_S$ and two semi-circular sections 17, 19 provided subsequent and thus adjacent to the straight portions. The oval form is respectively opened by an opening 21, 23 in a direction towards the deformation portion 14 in order to let the second part 14 proceed through that opening.

This allows that an enframing of the press portions 20, 22 of the second part 14 with the contact portions 26, 28 of the first part 12 may be realized in the direction of the spring force $F_S$ at the respective contact portion 26, 28 as well as in the opposite direction and additionally in at least two opposite directions being essentially perpendicular to the spring force $F_S$.

While the invention has been illustrated and described in detail in the drawings and foregoing description, such illustration and description are to be considered illustrative or exemplary and not restrictive; the invention is not limited to the disclosed embodiments. Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

REFERENCE SIGNS LIST 10 spring element
12 first part
14 second part
16 first contact
17 semi-circular portion
18 second contact
19 semi-circular portion
20 first press portion
21 opening
22 second press portion
23 opening
24 deformation portion
26 first contact portion
28 second contact portion
30 first contact area
32 second contact area
$F_S$ spring force

The invention claimed is:

1. A spring element for a power semiconductor module, comprising:
    a first part made from a first material and a second part made from a second material, the first material being different from the second material, wherein the first part comprises both a first contact portion having a first contact and a second contact portion having a second contact,
    wherein the first part comprises an electrically conductive path formed from the first contact portion to the second contact portion, and wherein the second part is adapted for exerting a spring force onto the first contact portion and the second contact portion for pressing the first contact to a first contact area of a power semiconductor module and the second contact to a second contact area of a power semiconductor module,
    wherein the second part comprises a first press portion, a second press portion, and a deformation portion for providing a spring force to the first press portion and the second press portion, wherein the first press portion is located opposite to the second press portion with regard to the deformation portion,
    wherein the first contact portion is located in vicinity to the first press portion and the second contact portion is located in vicinity to the second press portion such, that the spring force exerted by the deformation portion presses the first press portion against the first contact portion and the second press portion against the second contact portion,
    wherein at least one of the first press portion, the second press portion, the first contact portion and the second contact portion at least partly proceed perpendicular to the direction at which the spring force acts on the first contact portion and the second contact portion,
    wherein the first press portion is at least partly enframed by the first contact portion and the second press portion is at least partly enframed by the second contact portion in the direction of the spring force at the respective contact portion as well as in the opposite direction and additionally in at least two opposite directions being perpendicular to the spring force,
    wherein the first part forms a first bracket and wherein the second part forms a second bracket,
    wherein the first part is fixated to the second part by at least one form-locked connection,
    wherein the spring element consists of the first part and the second part, and
    wherein the first part and the second part each are formed as one-piece parts.

2. The spring element according to claim 1, wherein the first material has an electric conductivity of equal or more than $2.0 \times 10^7$ S/m.

3. The spring element according to claim 1, wherein the second material has a spring force being determined by the young modulus of equal or more than 100 GPa.

4. The spring element according to claim 1, wherein the first material is selected from the group consisting of copper, silver and aluminum.

5. The spring element according to claim 1, wherein the second material is selected from the group consisting of steel, steel alloys, copper alloys, bronze alloys, or nickel-alloys.

6. A power semiconductor module, comprising at least one spring element according to claim 1.

7. The power semiconductor module according to claim 6, wherein the spring element forms part of a control path for controlling the power semiconductor module.

8. The spring element according to claim 2, wherein the second material has a spring force being determined by the young modulus of equal or more than 100 GPa.

9. The spring element according to claim 2, wherein the first material is selected from the group consisting of copper, silver and aluminum.

10. The spring element according to claim 3, wherein the first material is selected from the group consisting of copper, silver and aluminum.

11. The spring element according to claim 2, wherein the second material is selected from the group consisting of steel, steel alloys, copper alloys, bronze alloys, or nickel-alloys.

12. The spring element according to claim 3, wherein the second material is selected from the group consisting of steel, steel alloys, copper alloys, bronze alloys, or nickel-alloys.

13. The spring element according to claim 4, wherein the second material is selected from the group consisting of steel, steel alloys, copper alloys, bronze alloys, or nickel-alloys.

14. The spring element according to claim 1, wherein the first material has an electric conductivity of equal or more than $2.0 \times 10^7$ S/m;
wherein the second material has a spring force being determined by the young modulus of equal or more than 100 GPa;
wherein the first material is selected from the group consisting of copper, silver and aluminium; and
wherein the second material is selected from the group consisting of steel, steel alloys, copper alloys, bronze alloys, or nickel-alloys.

15. The spring element according to claim 6, wherein the first material has an electric conductivity of equal or more than $2.0 \times 10^7$ S/m; and
wherein the second material has a spring force being determined by the young modulus of equal or more than 100 GPa.

16. The power semiconductor module according to claim 6, wherein the first material of spring element has an electric conductivity of equal or more than $2.0 \times 10^7$ S/m.

17. The power semiconductor module according to claim 6, wherein the second material has a spring force being determined by the young modulus of equal or more than 100 GPa.

18. The power semiconductor module according to claim 6, wherein the first material has an electric conductivity of equal or more than $2.0 \times 10^7$ S/m;
wherein the second material has a spring force being determined by the young modulus of equal or more than 100 GPa;
wherein the first material is selected from the group consisting of copper, silver and aluminium; and
wherein the second material is selected from the group consisting of steel, steel alloys, copper alloys, bronze alloys, or nickel-alloys.

* * * * *